United States Patent
Tani et al.

[11] Patent Number: 5,981,069
[45] Date of Patent: Nov. 9, 1999

[54] COPPER POWDER COATED WITH COPPER PHOSPHATE AND COPPER PASTE CONTAINING THE SAME

[75] Inventors: Hiroji Tani, Nagaokakyo; Naoaki Ogata, Moriyama, both of Japan

[73] Assignee: Murata Manufacturing Co., Ltd., Kyoto-fu, Japan

[21] Appl. No.: 08/796,925

[22] Filed: Feb. 7, 1997

[30] Foreign Application Priority Data

Mar. 1, 1996 [JP] Japan ................................. 8-044366

[51] Int. Cl.⁶ .................... B32B 5/16; B32B 3/00; C23C 22/00; H01B 1/02
[52] U.S. Cl. ................ 428/403; 428/209; 428/469; 148/250; 252/512; 75/228
[58] Field of Search .................. 428/402, 403, 428/323, 469, 209, 570; 252/512; 148/250, 253, 513, 514; 427/215, 216; 75/228

[56] References Cited

U.S. PATENT DOCUMENTS

| | | | |
|---|---|---|---|
| 3,881,914 | 5/1975 | Heidelberg | 75/370 |
| 4,070,518 | 1/1978 | Hoffman | 428/209 |
| 4,188,438 | 2/1980 | Burns | 428/209 |
| 4,264,379 | 4/1981 | Caule | 148/250 |
| 4,514,321 | 4/1985 | Siuta | 252/512 |
| 4,717,431 | 1/1988 | Knaster et al. | 428/628 |
| 4,868,034 | 9/1989 | Steinberg | 428/403 |
| 5,066,540 | 11/1991 | Mosser et al. | 428/336 |
| 5,807,508 | 9/1998 | Kawahara | 252/512 |

FOREIGN PATENT DOCUMENTS

| | | |
|---|---|---|
| 1-209784 | 8/1989 | Japan . |
| 3-239767 | 10/1991 | Japan . |
| 4-146973 | 5/1992 | Japan . |
| 4-308605 | 10/1992 | Japan . |

*Primary Examiner*—Deborah Jones
*Assistant Examiner*—StephEn Stein
*Attorney, Agent, or Firm*—Ostrolenk, Faber, Gerb & Soffen, LLP

[57] ABSTRACT

Copper powder has a coating made of copper phosphate at the outer surface thereof. The coating is formed by chemically reacting the outer surface of the copper powder and covers the entire surface of the copper powder uniformly, thereby obtaining excellent anti-oxidizing properties. It is preferable to set the copper phosphate ratio in term of phosphorus with respect to the total weight of the copper powder within the range of about 0.05 to 0.5 wt %.

21 Claims, 1 Drawing Sheet

COPPER POWDER COATED WITH COPPER PHOSPHATE AND COPPER PASTE CONTAINING THE SAME

BACKGROUND OF THE INVENTION

1. Field of the Invention

The present invention relates to a copper powder and copper paste used for forming a conductor on a ceramic electronic component.

2. Description of the Related Art

A ceramic electronic element generally has conductive patterns or conductors in or on a ceramic body. The conventional copper pastes used for producing such a ceramic electronic element are prepared by dispersing copper powder and glass frit in organic vehicle which consists of resin(s) and solvent. The copper paste is applied or printed onto a ceramic body, dried and then sintered under a weak oxidizing atmosphere. Typically, a nitrogen gas containing oxygen at about 100 ppm is employed in order to hasten burning the organic vehicle and eliminating contamination of carbon in the produced conductive patterns or conductors.

On the other hand, it is important to prevent the copper powder in a copper paste from being oxidized since the oxidation of the copper powder degrades the characteristics of the produced conductive patterns, such as adhesive properties and solderability and increases the resistivity thereof. Therefore, the conventional art has proposed various methods to subject copper powder used for conductive pastes to an anti-oxidizing treatment. For example, Japanese Laid-open Patent Publication Nos. 5-195005 and 5-195260 disclose methods to coat copper powder with a boric acid film acting as an anti-oxidizing film by immersing copper powder in boric acid.

However, the conventional art has the following drawbacks. Specifically, it is difficult to coat the entire outer surfaces of copper powder with boric acid perfectly. As a result, the copper powder prepared by the aforementioned conventional methods may be likely to be oxidized by oxygen present in the sintering atmosphere and portions of the outer surfaces of the copper powder are not covered with the boric acid. In the case where the boric acid film is made thick so as to perfectly cover the entire outer surfaces of the copper powder therewith, there arises another problem in that the copper paste shows poor adhesiveness to the ceramic due to the thick boric acid film.

SUMMARY OF THE INVENTION

The present invention overcomes the aforementioned drawbacks associated with the conventional art.

According to one preferred embodiment, copper powder is provided with a copper phosphate film on the entire outer surface thereof. The copper powder is preferably prepared by chemically reacting copper powder with a solution containing phosphate. It is more preferable that the copper powder includes the copper phosphate at the ratio of 0.05 to 0.5 wt % in term of phosphorus with respect to the total weight of said copper powder.

According to another aspect of the preferred embodiment, a copper paste includes the aforementioned copper powder and a ceramic electronic element has a conductive pattern of a sintered material of the copper paste.

Since the coating of the copper powder is formed by chemically reacting the outer surface of the copper powder, the coating covers the entire surface of the copper powder uniformly. Thus, it is possible to obtain excellent anti-oxidizing properties to realize a substantially perfect anti-oxidizing treatment. Moreover, the uniform formation of the coating minimizes the thickness required to prevent the copper powder from being oxidized. Therefore, the thinness of the coating of the conductive pattern or conductor formed on ceramic by using a copper paste including the copper powder has excellent adhesive properties and solderability.

Other features and advantages of the present invention will become apparent from the following description of the invention which refers to the accompanying drawings.

DETAIL DESCRIPTION OF PREFERRED EMBODIMENTS

Figure 1:
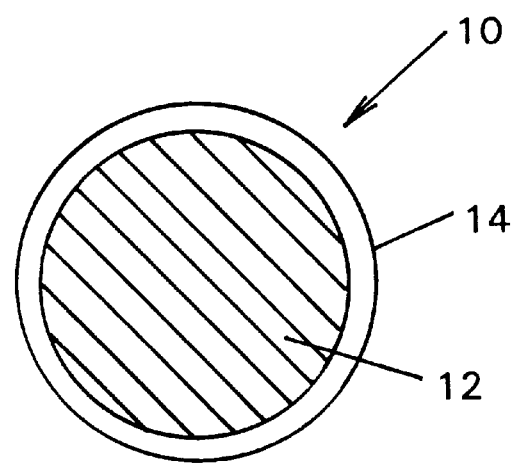
FIG. 1 shows a cross sectional view of copper powder according to the present invention.

FIG. 1 shows a cross section of copper powder according to one preferred embodiment of the present invention. Copper powder 10 includes a center portion 12 made of copper and a coating 14 made of copper phosphate. The copper powder 10 is prepared by immersing the copper powder to be subjected to an anti-oxidizing treatment into a solution containing a phosphate. During immersion of the copper powder into the solution containing phosphate, the outer surfaces of the copper powder reacts with phosphate chemically and turns it into copper phosphate. As a result, coating 14 and center portion 12 (which does not react with the phosphate) are formed. Since the chemical reaction changes the outer surface of the copper powder into copper phosphate, the obtained copper powder 10 is coated with the coating 14 of copper phosphate more uniformly than that obtained in the case of physical coating.

The phosphates which can be used for the present invention include polyphosphate such as pyrophosphate (diphosphate), triphosphate, tetraphosphate and hexaphosphate of sodium or potassium.

For example, 4.5 g of sodium pyrophosphate is dissolved into 300 ml of pure water to form a phosphate solution. 100 g of copper powder having a diameter of about 0.5 $\mu$m is then immersed in the phosphate solution. It is preferable that copper powder has a diameter in the range of about 0.2 $\mu$m to 1.0 $\mu$m. The solution is heated at about 50° C. and stirred for about 30 minutes. It is preferable that the phosphate solution is kept at about 30° C. or more during the chemical reaction so as to ensure the formation of copper phosphate. Thereafter, the copper powder is separated from the solution by filtration, rinsed with alcohol such as methanol and dried in vacuum, thereby obtaining copper powder in which entire outer surfaces are covered with copper phosphate at a ratio of about 0.2 wt % in term of phosphorus with respect to the total weight of the copper powder. The ratio of phosphate in term of phosphorous with respect to the total weight on the copper powder can be measured, for example, by a ICP-AES (Induced plasma-Auger Electron Spectroscopy) method.

The phosphate ratio with respect to total weight of the copper powder can be controlled by adjusting the concentration of phosphate solution, reaction temperature and reaction time. It has been confirmed by the inventors that the phosphate ratio increases as any of the concentration of the phosphate solution, the reaction temperature and the reaction time increase. In order to find a preferable phosphate ratio, copper powders having different phosphate ratios indicated as Examples 1–7 in Table 1 were prepared by changing the aforementioned conditions. Then, these copper powders were kept in air (oxygen concentration of 21%) at about 40° C. to examine if the copper powders were oxidized. Comparative example 1 which was not subjected to anti-oxidizing treatment and Comparative example 2 which was subjected to a conventional boric acid treatment were also prepared and examined. The obtained results are shown in Table 1.

TABLE 1

|  | Ratio | Duration time (Hrs) | | | | | |
|---|---|---|---|---|---|---|---|
|  |  | 0 | 50 | 100 | 200 | 500 | 1000 |
| Exp. 1 | 0.01 wt % | Good | Good | Ox. | Ox. | Ox. | Ox. |
| Exp. 2 | 0.02 wt % | Good | Good | Good | Good | Ox. | Ox. |
| Exp. 3 | 0.05 wt % | Good | Good | Good | Good | Good | Good |
| Exp. 4 | 0.1 wt % | Good | Good | Good | Good | Good | Good |
| Exp. 5 | 0.2 wt % | Good | Good | Good | Good | Good | Good |
| Exp. 6 | 0.5 wt % | Good | Good | Good | Good | Good | Good |
| Exp. 7 | 1.0 wt % | Good | Good | Good | Good | Good | Good |
| Com. exp. 1 | 0.0 wt % | Good | Ox. | Ox. | Ox. | Ox. | Ox. |
| Com. exp. 2 | 0.1 wt % (Boric acid) | Good | Good | Good | Ox. | Ox. | Ox. |

Ratio: Phosphate ratio in terms of phosphorous with respect to the total weight of copper powder.
Good: No oxidation occurs.
Ox. Oxidation occurs.

As is shown in Table 1, the copper powder subjected to no anti-oxidizing treatment (Comparative example 1) was oxidized within 50 hours and the copper powder subject to a conventional anti-oxidizing treatment (Comparative Example 2) was oxidized within 200 hours, while the copper powder having a phosphate ratios of 0.01 wt % (Example 1) and 0.02 wt % (Example 2) were not oxidized until 50 hours and 200 hours, respectively. Moreover, the copper powder having a phosphate ratio of 0.05 wt % or more (Examples 3–7) was not oxidized even after 1000 hours. Thus, it is apparent that the copper powder of the present invention is improved in anti-oxidizing properties. It is appreciated that copper powder preferably has a phosphate ratio of 0.05 wt % or more to obtain better anti-oxidizing properties.

Hereinafter, a copper paste using the aforementioned copper powder of the present invention and a ceramic electronic element produced using the copper paste will be explained.

The copper powders Examples 1 to 7 and Comparative examples 1 and 2 in Table 1 were first prepared. Each copper powder of Examples 1 to 7 and Comparative examples 1 and 2 and a glass frit were thoroughly mixed and dispersed in organic vehicle consisting of a resin and a solvent so as to form a copper paste in which the copper powder, glass frit and organic vehicle were contained at the ratio of 78:7:15 by weight. It is preferable to use lead borosilicate glass as the glass frit, cellulose resin or alkyd resin as the resin in the vehicle and terpineol or alcohol as the solvent in the vehicle, although other materials can also be used.

Each of the copper pastes prepared by the aforementioned process was then printed on an alumina substrate to form a predetermined pattern. Each pattern was dried and sintered for 10 minutes under a weak oxidizing atmosphere containing oxygen at about 100 ppm.

The following Table 2 shows the results obtained by subjecting the conductive patterns of Examples 1 to 7 and Comparative examples 1 and 2 to an adhesive test and a solderability test.

TABLE 2

|  | Copper powder (wt %) | Glass frit (wt %) | Vehicle (wt %) | Copper Phosphate (wt %) | Adhesiveness (kgf/2 mm$^2$) | Solderability |
|---|---|---|---|---|---|---|
| Exp. 1 | 78 | 7 | 15 | 0.01 | 2.0 (fair) | fair |
| Exp. 2 | 78 | 7 | 15 | 0.02 | 3.0 (good) | fair |
| Exp. 3 | 78 | 7 | 15 | 0.05 | 3.0 (good) | good |
| Exp. 4 | 78 | 7 | 15 | 0.1 | 3.0 (good) | good |
| Exp. 5 | 78 | 7 | 15 | 0.2 | 3.0 (good) | good |
| Exp. 6 | 78 | 7 | 15 | 0.5 | 3.0 (good) | good |
| Exp. 7 | 78 | 7 | 15 | 1.0 | 2.5 (fair) | good |
| Com. exp. 1 | 78 | 7 | 15 | 0.0 | 1.5 (bad) | bad |
| Com. exp. 2 | 78 | 7 | 15 | 0.1 (Boric acid) | 2.0 (fair) | fair |

As is shown in Table 2, Comparative Examples 1 and 2 show bad results and fair results in adhesiveness and solderability, respectively, while Examples 3 to 6 shows good results in both adhesiveness and solderability. Example 1 shows fair results in both adhesiveness and solderability, and Examples 2 and 7 shows a fair result in either the adhesiveness or the solderability, respectively. From these results, it is preferable to set the copper phosphate ratio in terms of phosphorus with respect to the total weight of the copper powder in the range of about 0.05 to 0.5 wt %.

In order to confirm the effect of the invention, other samples were prepared and tested. Specifically, the copper powders explained as Examples 1 to 7 and Comparative Examples 1 and 2 in Table 1 were dispersed in an organic vehicle to form the copper pastes having the components ratios as shown in Table 3. Note that these copper pastes contain no glass frit. A Ba—Al—Si type substrate for a low temperature multilayered substrate was prepared, and each of the prepared copper pastes was printed onto the Ba—Al—Si type substrate and sintered under the same condition as explained above, thereby forming a conductive pattern on the substrate.

TABLE 3

|  | Copper powder (wt %) | Glass frit (wt %) | Vehicle (wt %) | Copper Phosphate (wt %) | Adhesiveness (kgf/2 mm$^2$) | Solderability |
|---|---|---|---|---|---|---|
| Exp. 1 | 85 | 0 | 15 | 0.01 | 1.8 (fair) | fair |
| Exp. 2 | 85 | 0 | 15 | 0.02 | 2.5 (good) | fair |
| Exp. 3 | 85 | 0 | 15 | 0.05 | 2.5 (good) | good |
| Exp. 4 | 85 | 0 | 15 | 0.1 | 2.5 (good) | good |
| Exp. 5 | 85 | 0 | 15 | 0.2 | 2.5 (good) | good |
| Exp. 6 | 85 | 0 | 15 | 0.5 | 2.5 (good) | good |
| Exp. 7 | 85 | 0 | 15 | 1.0 | 2.0 (fair) | good |
| Com. exp. 1 | 85 | 0 | 15 | 0.0 | 1.5 (bad) | bad |
| Com. exp. 2 | 85 | 0 | 15 | 0.1 (Boric acid) | 2.0 (fair) | fair |

Table 3 shows the results obtained by testing the conductive patterns prepared using the aforementioned copper powders. As is apparent from Table 3, the results show the same tendency as that of Table 2. That is, it is preferable to set the copper phosphate ratio in term of phosphorus with respect to the total weight of the copper powder within the range of about 0.05 to 0.5 wt % (Examples 3 to 6) so as to obtain conductive pattern which shows excellent adhesiveness and solderability.

As a result of further study, it has confirmed that the coating 14 of copper powder 10 (FIG. 1) has a thickness within the range about 2 nm to 20 nm in the case where the copper powder has the aforementioned copper phosphate ratio. Further, it is preferable that the copper paste includes about 60 to 90 wt % of the copper powder, 0 to about 20 wt % of glass frit and about 10 to 30 wt % of organic vehicle. Of course, the copper powder of the present invention can be also applied to a ceramic electronic element including a dielectric substrate other than an alumina substrate or Ba—Al—Si type substrate.

Figure 2:
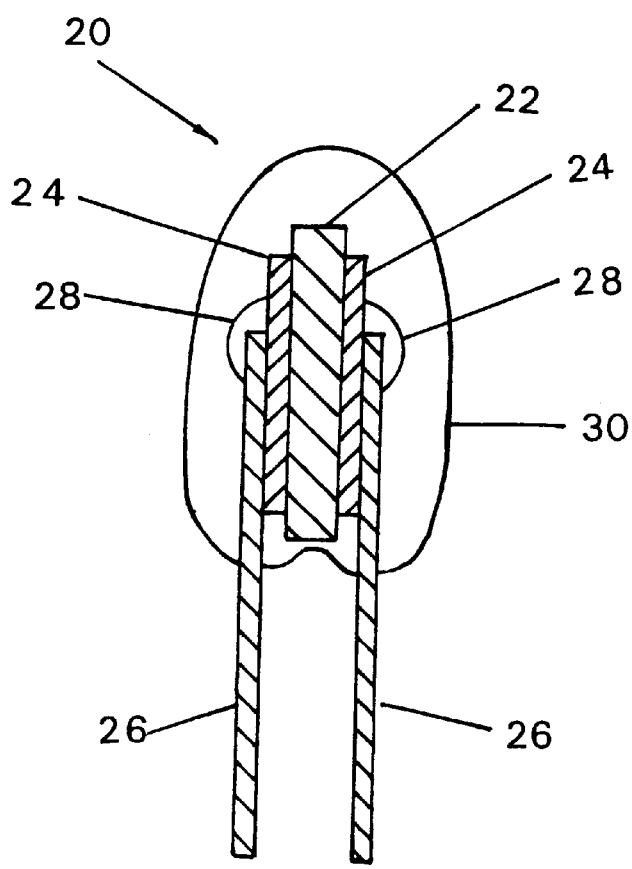
FIG. 2 shows a cross sectional view of ceramic capacitor according to the present invention.

FIG. 2 shows a cross section of ceramic capacitor as one example of ceramic electronic elements according to the present invention. Although FIG. 2 shows a ceramic capacitor, it is appreciated that present invention can be applied to other ceramic electronic elements such, an electrical resistance element, a piezoelectric element, a circuit board, etc. The ceramic capacitor 20 includes a dielectric ceramic body 22 of plate shape and a pair of copper electrodes 24 interposing the dielectric ceramic body 22. Terminals 26 are electrically connected to the pair of copper electrodes 24, respectively, through solder 28. The dielectric ceramic body and the electrodes 24 are coated with an outer resin 30. In the ceramic capacitor 20, the electrode 24 are formed by applying the copper paste, explained above in detail, onto the ceramic body 22 and sintered it under a weak oxidizing atmosphere. Since the electrodes 24 must be in contact with both the ceramic body 22 and the solder 28, the paste of the present invention is suitably applied to such electrodes.

As has been explained above, the copper powder according to the present invention has a coating made of copper phosphate at the outer surface thereof. Since the coating is formed by chemically reacting the outer surface of the copper powder, the coating covers the entire surface of the copper powder uniformly. Thus, it is possible to obtain better anti-oxidizing properties than that conventionally obtained by forming boric acid coating and to realize a better anti-oxidizing treatment. The conductive pattern of conductor formed on ceramic by using the copper paste including the copper powder has excellent adhesive properties and solderability.

While the invention has been described in detail and with reference to specific embodiments thereof, it will be apparent to one skilled in the art that various change and modifications can be made therein without departing from the spirit and scope thereof.

What is claimed is:

1. Copper powder having a copper phosphate chemical reaction product film on the outer surface thereof, wherein said copper phosphate is at a ratio of 0.02 to 0.5 wt % in term of phosphorus with respect to a total weight of said copper powder.

2. Copper powder having a copper phosphate chemical reaction product film on the outer surface thereof, wherein said copper phosphate film has a thickness in the range of about 2 to 20 nm.

3. Copper powder according to claim 1, wherein said copper phosphate is at a ratio of 0.05 to 0.5 wt % in terms of phosphorus with respect to a total weight of said copper powder.

4. Copper powder according to claim 3, wherein said copper powder has a diameter of about 0.2 to 1.0 $\mu$m.

5. Copper powder according to claim 4, wherein said copper phosphate film has a thickness in the range of about 2 to 20 nm.

6. Copper powder according to claim 1, wherein said copper phosphate film has a thickness in the range of about 2 to 20 nm.

7. A copper paste comprising an organic vehicle having the copper powder of claim 1 dispersed therein.

8. A copper paste according to claim 7, further comprising glass frit, wherein said paste contains about 60 to 90 wt % of said copper powder, 0 to about 20 wt % of glass frit and about 10 to 30 wt % of said organic vehicle.

9. A copper paste comprising an organic vehicle having the copper powder of claim 2 dispersed therein.

10. A copper paste according to claim 8, wherein said copper powder has a diameter of about 0.2 to 1.0 $\mu$m.

11. A copper paste according to claim 10, where said copper phosphate film has a thickness in the range of about 2 to 20 nm.

12. A copper paste according to claim 7, wherein said copper phosphate film has a thickness in the range of about 2 to 20 nm.

13. A ceramic electronic element comprising a ceramic body and a conductive pattern provided at said ceramic body, said conductive pattern comprising a sintered copper powder of claim 1.

14. A ceramic electronic element comprising a ceramic body and a conductive pattern provided at said ceramic body, said conductive pattern comprising a sintered copper powder of claim 2.

15. A ceramic electronic element according to claim 13, wherein said copper powder has a diameter of about 0.2 to 1.0 $\mu$m.

16. A ceramic electronic element according to claim 15, wherein said copper phosphate film has a thickness in the range of about 2 to 20 nm.

17. A ceramic electronic element according to claim 13, wherein said copper phosphate film has a thickness in the range of about 2 to 20 nm.

18. A method for producing copper powder used to prepare a copper paste, comprising the steps of:

immersing copper powder into a solution containing phosphate to form a copper phosphate film on the outer surface of said copper powder by chemical reaction; and recovering said copper powder from said solution.

19. A method for producing copper powder used to prepare a copper paste according to claim 18, wherein said immersion is at a temperature of at least about 30° C.

20. A method for producing copper powder used to prepare a copper paste according to claim 18, wherein said immersing step is continued until that said copper powder comprises copper phosphate at a ratio of 0.02 to 0.5 wt % in terms of phosphorus with respect to a total weight of said copper powder.

21. A method for producing copper powder used to prepare a copper paste according to claim 20, wherein said copper powder has a diameter of about 0.2 to 1.0 $\mu$m.

* * * * *